United States Patent
Van Lammeren et al.

(10) Patent No.: US 9,554,473 B2
(45) Date of Patent: Jan. 24, 2017

(54) APPARATUS AND METHOD FOR PROVIDING AN EMBEDDED STRUCTURE AND FOR PROVIDING AN ELECTRO-OPTICAL DEVICE INCLUDING THE SAME

(75) Inventors: Tim Johannes Van Lammeren, Delft (NL); Eric Rubingh, Delft (NL)

(73) Assignee: Nederlandse Organisatie voor toegepastnatuurwetenschappelijk onderzoek TNO, Delft (NL)

(*) Notice: Subject to any disclaimer, the term of this patent is extended or adjusted under 35 U.S.C. 154(b) by 199 days.

(21) Appl. No.: 14/009,164

(22) PCT Filed: Mar. 30, 2012

(86) PCT No.: PCT/NL2012/050205
§ 371 (c)(1),
(2), (4) Date: Feb. 12, 2014

(87) PCT Pub. No.: WO2012/134286
PCT Pub. Date: Oct. 4, 2012

(65) Prior Publication Data
US 2014/0199473 A1 Jul. 17, 2014

(30) Foreign Application Priority Data
Apr. 1, 2011 (EP) ..................... 11160840

(51) Int. Cl.
*H05K 3/12* (2006.01)
*H01L 51/00* (2006.01)
(Continued)

(52) U.S. Cl.
CPC ......... *H05K 3/1275* (2013.01); *H01L 51/0022* (2013.01); *H01L 51/5212* (2013.01);
(Continued)

(58) Field of Classification Search
CPC ............. H05K 3/00; H05K 1/00; H01L 51/00; H01L 2251/00
See application file for complete search history.

(56) References Cited

U.S. PATENT DOCUMENTS 5,693,375 A    12/1997  Sato et al.
2005/0164425 A1*  7/2005  Tuomikoski et al. .......... 438/99
(Continued)

FOREIGN PATENT DOCUMENTS

JP    2005-050969 A    2/2005
JP    2006-156930 A    6/2006
(Continued)

OTHER PUBLICATIONS

Int'l Search Report issued on Jun. 26, 2012 in Int'l Application No. PCT/NL2012/050205.
(Continued)

*Primary Examiner* — Gordon R Baldwin
*Assistant Examiner* — Mohammad Mayy
(74) *Attorney, Agent, or Firm* — Panitch Schwarze Belisario & Nadel LLP (57) ABSTRACT

An apparatus for providing a patterned structure includes a deposition facility for depositing an electrically conductive material on a cylindrical surface of a transfer roll, a supply facility for providing a flexible substrate with a carrier layer, a press-roll for pressing the flexible substrate with the carrier layer against the surface of the transfer roll, the press-roll being positioned in the rotation direction of the transfer roll with respect to a position where the first deposition facility deposits the substance on the transfer roll, and being arranged for embedding the deposited substance in said carrier layer, wherein the adhesion between the printed substance and the cylindrical surface of the transfer roll is less than the adhesion between the printed substance and said carrier layer, a transport facility for releasing the flexible substrate with the carrier layer embedding the substance as the patterned structure from the transfer roll.

2 Claims, 9 Drawing Sheets

(51) Int. Cl.
_H01L 51/52_ (2006.01)
*H01L 51/56* (2006.01)
*H05K 1/09* (2006.01)

(52) U.S. Cl.
CPC ...... *H01L 51/56* (2013.01); *H01L 2251/5338* (2013.01); *H05K 1/097* (2013.01)

(56) References Cited

U.S. PATENT DOCUMENTS

| | | |
|---|---|---|
| 2007/0295400 A1 | 12/2007 | Brabec et al. |
| 2009/0166059 A1 | 7/2009 | Chen et al. |
| 2009/0218678 A1 | 9/2009 | Kawabata et al. |
| 2009/0288567 A1* | 11/2009 | Choi et al. .................. 101/154 |
| 2010/0012364 A1 | 1/2010 | Kim et al. |
| 2010/0230154 A1 | 9/2010 | Naito et al. |

FOREIGN PATENT DOCUMENTS

| | | |
|---|---|---|
| JP | 2006-289983 A | 10/2006 |
| JP | 2008-047355 A | 2/2008 |
| WO | 2008/139934 A1 | 11/2008 |
| WO | 2008149969 A1 | 12/2008 |
| WO | 2010005301 A1 | 1/2010 |
| WO | 2011/016725 A1 | 2/2011 |

OTHER PUBLICATIONS

Office Action issued Oct. 27, 2015 in JP Application No. 2014-502499 translation only.

* cited by examiner

APPARATUS AND METHOD FOR PROVIDING AN EMBEDDED STRUCTURE AND FOR PROVIDING AN ELECTRO-OPTICAL DEVICE INCLUDING THE SAME

CROSS-REFERENCE TO RELATED APPLICATION

This application is a Section 371 of International Application No. PCT/NL2012/050205, filed Mar. 30, 2012, which was published in the English language on Oct. 4, 2012, under International Publication No. WO 2012/134286 A1, and the disclosure of which is incorporated herein by reference.

BACKGROUND OF THE INVENTION

Field of the invention

The present invention relates to an apparatus for providing an embedded structure.

The present invention further relates to a method for providing an embedded structure.

The present invention further relates to an apparatus for manufacturing an opto-electric device.

The present invention further relates to a method for manufacturing an opto-electric device.

Related Art

Opto-electric devices basically are constructed as an opto-electric medium sandwiched between a first and a second electrically conductive layer. At least one of these layers should be transparent to allow for a transmission of photonic radiation generated in the layer to the environment, in the case of a light-emitting device, such as an OLED. Likewise, in the case of a photo-voltaic device at least one transparent electrically conductive layer is required to allow photonic radiation from the environment to enter the photo-voltaic medium between the electrically conductive layers. Although transparent, electrically conductive materials, e.g. metal oxides, such as indium tin oxide (ITO) and organic materials such as PEDOT are known, the requirements of transparency and electrical conductivity are mutually conflicting. If the layer is sufficiently thin not to hamper light transmission then a significant voltage drop occurs in the layer. However, applying an increased layer thickness to improve conductivity will result in an unacceptably low transparency. An approach to overcome this dilemma is to apply a relatively thin transparent electrically conductive layer in combination with a grid of an electrically conductive material in electrical contact with the layer. In order that the grid is substantially invisible a target line width for the grid elements is in the order of 500 µm or less, but preferably the width is less than 50 µm. In order to obtain a target conductivity of 1 sq/Ω with this feature size of 50 um the lines must be several microns thick. The thicknesses of these lines complicate the further production process, because their topology greatly influences the spreading and covering of the layers that have to be coated on them.

US2009/0288567 discloses an apparatus for manufacturing electronic devices using a roll-to-roll rotary pressing process. The apparatus comprises a winding roll around which flexible printing paper is wound; a plurality of printing units; at least one coating unit; a rewinding roll to rewind the printing paper when printing has been completed. The apparatus further comprises a plurality of drying units.

U.S. Pat. No. 5,693,375 discloses a method for transferring ink on a plate onto a material to be printed. This is realized by a printing method that involves the steps of: providing the ink at predetermined positions on the plate. An electric field is applied to the ink to maintain configuration of the ink provided at the predetermined positions on the plate. This results in an increased viscosity of the ink so that it assumes a solidified state or a semi-solidified state. The ink is then transferred onto the material to be printed while maintaining the ink in the solidified or semi-solidified state.

WO2011/016725 discloses a method of manufacturing an opto-electric device. The method comprises the steps of providing a substrate, overlying a first main side of the substrate with an electrically interconnected open shunting structure, embedding the electrically interconnected open shunting structure in a transparent layer, removing the substrate from the embedded electrically interconnected open shunting structure, depositing a functional layer structure over a free surface formed after removal of the substrate.

SUMMARY OF THE INVENTION

It is a purpose of the invention to provide an apparatus with which an embedded structure, in particular an embedded electrically conductive structure with a relatively high conductivity, can be efficiently provided.

It is a further purpose to provide an apparatus for manufacturing an opto-electric device.

It is also a purpose of the invention to provide an efficient, practical method for providing an embedded structure, in particular an embedded electrically conductive structure with a relatively high conductivity.

It is a further purpose to provide a method for manufacturing an opto-electric device.

According to a first aspect of the invention an apparatus for providing an embedded structure comprises a first deposition facility for depositing a substance or a precursor thereof in a patterned way on a cylindrical surface of a transfer roll having a rotation direction. The substance typically comprises an electrically conductive material, but also insulating or semiconducting materials may be used. The apparatus has a supply facility for supplying a flexible substrate with a carrier layer towards the transfer roll.

The carrier layer may be a surface layer of the flexible substrate. Alternatively the carrier layer may be formed by a separate layer of a carrier material applied on the substrate. In that case the supplied flexible substrate may be a prepared substrate, already having the layer of carrier material. Alternatively the layer of the carrier material may be deposited on the flexible substrate just before it is carried to the transfer roll.

A press-roll is arranged for pressing the flexible substrate with the carrier layer against the surface of the transfer roll. The press-roll is positioned in the rotation direction of the transfer roll with respect to a position where said substance is deposited on the transfer roll. Due to the pressure exerted on the flexible substrate the deposited substance is embedded in the carrier layer of the flexible foil. The embedded (electrically conductive) substance forms an (electrically conductive) structure.

The adhesion between the printed substance and the cylindrical surface of the transfer roll is less than the adhesion between the printed substance and the carrier layer so that the substance is easily transferred from the transfer roll to the carrier layer and the deposited substance remains embedded in said carrier layer after the flexible substrate is released from the surface of the transfer roll.

A transport facility is further provided for releasing the flexible substrate from the transfer roll.

The apparatus of US2009/0288567 referred to above has a press roll 28. According to the description of US2009/0288567, "All of the ink, hardened by the instantaneous drying operation performed twice, is pressurized by the press roll 28 to be printed on the printing paper 1". Accordingly, the press roll 28 is not arranged for embedding the ink in the printing paper.

As indicated above, U.S. Pat. No. 5,693,375 discloses a method for transferring ink on a plate onto a material to be printed. To that end a pressure drum 47 is used. The pressure drum 47 transfers the ink onto the material to be printed, and hence is not arranged for embedding the ink in the material to be printed.

According to a second aspect of the invention an analogous method for providing an (electrically conductive) structure is provided, comprising the steps of
  depositing a substance (comprising an electrically conductive material) or a precursor thereof in a patterned way on a cylindrical surface of a transfer roll,
  providing a flexible substrate with a carrier layer
  pressing the flexible substrate with the carrier layer against the surface of the transfer roll, therewith embedding the deposited substance in said carrier layer, wherein an adhesion between the printed substance and the cylindrical surface of the transfer roll is less than an adhesion between the printed substance and said carrier layer, the embedded substance forming an (electrically conductive) structure,
  releasing the flexible substrate with the carrier layer embedding the patterned (electrically conductive) structure from the transfer roll.

It is noted that the process of WO2011/016725 results in an embedded shunting structure. In WO2011/016725 the embedded shunting structure is not obtained by applying pressure, but by layer deposition. It is for example specifically mentioned in the cited WO-publication that the first sublayer 32 of the transparent layer wherein the shunting structure will be embedded is deposited conformal with the shunting structure 20.

Hence, the present invention provides a roll to roll compatible apparatus according to the first aspect and method according to the second aspect to print, sinter and embed conductive lines resulting in a conductive grid coplanar with the active surface. As a consequence, the deposition of subsequent layers is not hampered by the presence of a rough surface topology.

Although various options are possible, the first deposition facility preferably is a printing facility. Various printing facilities are available. An ink-jet printer may be used for example if the substance to be printed has a relatively low viscosity and a screen printer may be used if the substance to be printed has a relatively high viscosity.

Various substances may be used as the substance comprising an electrically conductive material or a precursor thereof. For example a molten metal may be deposited as the substance forming an electrically conductive material. After deposition the metal cools down and solidifies. A suitable material for this purpose is for example silver or tin, having relatively low melting points and a good conductivity. It is an advantage of this embodiment that a separate curing facility for curing the substance is not necessary.

Alternatively, an ink containing metal nano particles may be deposited as the substance being a precursor for an electrically conductive material. After deposition of this substance on the transfer roll it can be cured and therewith transformed into an electrically conductive material. In case an ink containing nano-particles is used the nano-particles are sintered. In the sequel the wording "curing" is understood to mean "sintering" where applicable.

In another alternative embodiment the substance deposited on the transfer roll is a metal complex solution. Likewise, after deposition of this substance on the transfer roll it can be cured and therewith transformed into an electrically conductive material.

An advantage of the latter two embodiments is that the time of curing of the substance can be accurately determined by the position where the curing facility for the substance is arranged and by the device(s) and settings selected for this purpose.

In an embodiment the substance is cured before it is embedded within the carrier layer. In the cured state the substance will be easier embedded in the carrier layer.

In an alternative embodiment the substance is cured while pressing the flexible substrate with the carrier layer against the surface of the transfer roll.

If desired a plurality of substances is applied as a stack of layers. The stack may comprise other layers of additional substances, e.g. an insulating substance or a semiconducting substance.

The apparatus may comprise one or more of a heat source, a photon radiation source and a micro-wave source as the curing facility for curing a precursor for an electrically conductive material.

Also the use of electrically conductive polymers could be considered as the electrically conductive material to be embedded. In practice however, these materials have a relatively low conductivity in comparison to metals.

Also various options are available for the carrier layer used as the embedding medium for the electrically conductive material.

In an embodiment the carrier layer at least locally has a first relative soft state in a region where the flexible substrate is pressed against the cylindrical surface of the transfer roll and a relative hard state after the substance is embedded in the carrier layer. The substance therewith becomes even more firmly embedded in the carrier layer.

The difference between the relatively soft and the relatively hard state of the carrier layer can be achieved in various ways. In an embodiment the apparatus has a second deposition facility that deposits a layer of a carrier material in a first relatively soft state on the flexible substrate and the apparatus has a transforming facility for transforming the layer of the carrier material into a second, relatively hard state after the substance is embedded in the layer.

In an embodiment of the apparatus the carrier material deposited by the second depositing facility is a precursor for a polymer. The second deposition facility is for example a printing facility or a spray coating facility. In that embodiment the transforming facility comprises a curing facility for curing the layer of the carrier material. The curing facility may comprise a heat source and/or a photon radiation source.

In another embodiment the carrier material deposited by the second depositing facility is a thermo-elastic polymer and the transforming facility provides for a difference in temperature at which the carrier material is deposited and the environmental temperature. The thermo-elastic polymer is deposited in a heated and therewith weakened state at the surface of the flexible substrate and hardens upon cooling down. This is advantageous in that a separate curing facility is not necessary. An advantage of the other embodiment, employing a precursor of a polymer as the carrier material to be deposited is that the hardening of the carrier layer can be easily timed by a choice of the position of the curing facility for the carrier material and the means used for the curing facility.

In a particular embodiment the apparatus is arranged for temporarily softening the carrier layer while the flexible substrate is pressed between the press-roll and the transfer roll. This may be achieved by heating the carrier layer during its presence in the nip formed by the press-roll and the transfer roll.

In a particular embodiment this is achieved in that the apparatus has a facility for heating the substance to a temperature higher than a temperature of the cylindrical surface. The increased temperature of the heated substance causes the carrier layer to soften locally. The substance may be heated when it is deposited, e.g. for example when it is deposited as a molten metal. Alternatively the substance may be heated after its deposition on the transfer roll, e.g. when sintering a substance formed by a curable mixture. To that end the transfer roll may be provided with a heating facility.

The carrier layer may be integral with the flexible substrate. Due to the relatively low heat capacity of the tracks only the carrier layer will locally soften, while the underlying material of the substrate is not effected.

Alternatively the carrier layer may be heated by pulse wise application of photon radiation. Depending on a duration of the pulses the carrier layer can be heated without heating the underlying material. This method can be used if the underlying material has a relatively low melting point. The method is also suitable if the carrier layer is formed by the flexible substrate itself.

In an embodiment of the apparatus the cylindrical surface of the transfer roll is provided with grooves for receiving the substance to be deposited. This makes it possible that the embedded structure has a height to width ratio that is greater than would be possible in the absence of such grooves.

The electrically conductive structure so obtained is particularly suitable for use in an opto-electric device. As the electrically conductive structure is embedded in the carrier layer on the substrate, a planar surface is available that facilitates application of further functional layers in a method and apparatus according to the invention.

Hence, an apparatus according to a third aspect of the invention is provided for manufacturing an opto-electric device. The apparatus comprises an apparatus according to the first aspect for providing an electrically conductive structure and additionally comprises
 a facility for applying a first electrode layer on the layer, in electrical contact with the electrically conductive structure embedded therein,
 a facility for applying an opto-electric structure on said first electrode layer, and
 a facility for applying a second electrode layer on said opto-electric structure.

Additionally, a method according to a fourth aspect of the invention is provided for manufacturing an opto-electric device. The method comprises the steps involved in the method according to the second aspect of the invention of providing an electrically conductive structure embedded in a layer on a flexible substrate. In addition the method comprises the following steps,
 applying a first electrode layer on the layer, in electrical contact with the electrically conductive structure embedded therein,
 applying an opto-electric structure on said first electrode layer, and
 applying a second electrode layer on said opto-electric structure.

BRIEF DESCRIPTION OF THE DRAWINGS

These and other aspects are described in more detail with reference to the drawing. Therein:

FIG. 1A shows a detail according to IA in FIG. 1A, FIGS. 2A, 2B and 2C show a series of cross-sections through the flexible substrate at respective encircled positions in the apparatus of FIG. 1, indicated with A, B and C.

DETAILED DESCRIPTION OF EMBODIMENTS

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

In the drawings, the size and relative sizes of layers and regions may be exaggerated for clarity.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skilled in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

Figure 1:
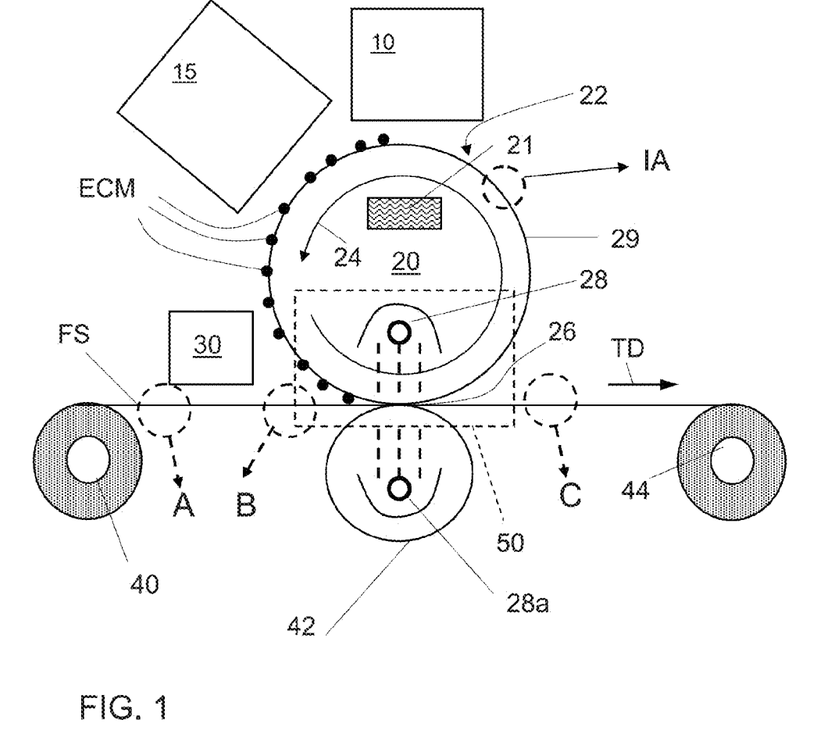
FIG. 1 shows an embodiment of an apparatus according to the first aspect of the present invention.

Similar parts have the same reference throughout the application. FIG. 1 shows an apparatus according to the first aspect for providing an electrically conductive structure. The apparatus comprises a first deposition facility 10 for depositing a substance comprising an electrically conductive material ECM or a precursor thereof in a patterned way on a cylindrical surface 22 of a transfer roll 20 having a rotation direction 24. The cylindrical surface 22 of the transfer roll was provided with a coating to provide for a low adhesion between the substance and the cylindrical surface. In this case a SiN coating was used as the ceramic coating. Instead of providing a separate ceramic coating, the transfer roll may be made itself of a material such as glass, having a low adhesion for the substance. Alternatively or in addition a surface treatment, such as a plasma treatment may be applied to the cylindrical surface 22 of the roll 20 to achieve a low adherence.

In this embodiment the substance is printed as lines extending in the length direction of the transfer roll 20, i.e. parallel to the rotation axis of the transfer roll 20.

The deposited substance ECM is cured by curing facility 15. The curing facility includes for example a heating device, a microwave device or a photon radiation device e.g. a UV-source. In addition the transfer roll 20 may be provided with a heating facility 21 for facilitating curing of the deposited substance ECM. In some embodiments a curing facility may be absent, for example if a molten metal is printed as a substance on the cylindrical surface 22.

In the embodiment shown, the apparatus has a second deposition facility 30 for depositing a layer of a carrier material (CM, FIG. 2) having a first hardness state on a flexible substrate FS. The second deposition facility may for example be a printing facility or a coating facility. In an embodiment the layer of a carrier material is deposited according to a pattern. For example the layer of carrier material may be deposited according to a pattern corresponding to the pattern of electrically conductive material.

Alternatively the carrier layer formed by a layer of a carrier material CM may already be present on the flexible substrate FS.

In again another embodiment, the carrier layer CM is formed by the flexible substrate FS. In that case an additional process step for applying a layer of a carrier material on the flexible substrate is avoided. The flexible substrate FS may for example be a PET foil having a thickness of 50 μm and a pattern having a thickness of 5 μm may be formed in the PET-foil. In that case the upper layer of 5 μm of the PET foil is considered as the carrier layer CM.

The flexible substrate is for example a polymer foil of the type PEN, PET, PE, PP, PVA, PI, etc. and may have a thickness in a range from 25 to 500 micron for example.

Figure 2A:
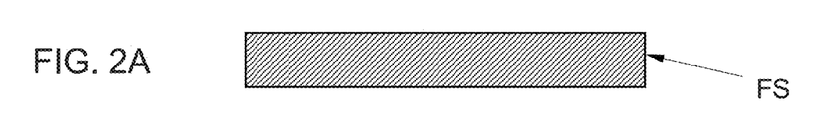
Figure 2B:
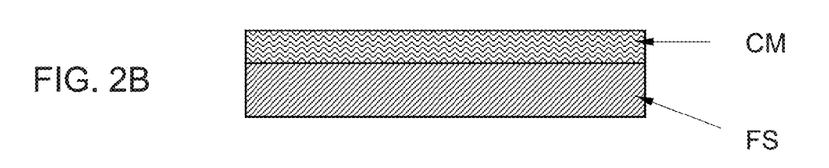
Figure 2C:
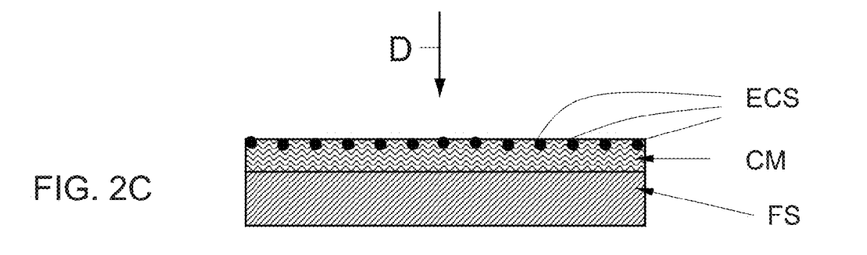

FIGS. 2A, 2B and 2C show a series of cross-sections through the flexible substrate at respective encircled positions in the apparatus of FIG. 1, indicated with A, B and C. The horizontal direction in FIG. 2A-2C corresponds to the horizontal direction in FIG. 1, i.e. the transport direction TD of the flexible substrate FS.

FIG. 2A schematically shows a cross-section of the flexible substrate FS, at position A indicated in FIG. 1. FIG. 2A shows the flexible substrate as it is provided from the supply roll 40.

FIG. 2B shows a cross-section at position B in FIG. 1. At this position the layer of a carrier material CM having a first hardness state is deposited on the flexible substrate FS.

A supply facility carries the flexible substrate FS, having the layer CM, towards the transfer roll 20. In this case the combination of the transfer roll 20 and the press-roll 42 exert a pulling force on the flexible substrate FS, that cause the flexible substrate FS to move towards the transfer roll 20. However, alternative or additional transfer facilities may be present. For example the storage roll 44 may be wound with sufficient force to function as the transfer facility.

Figure 2D:
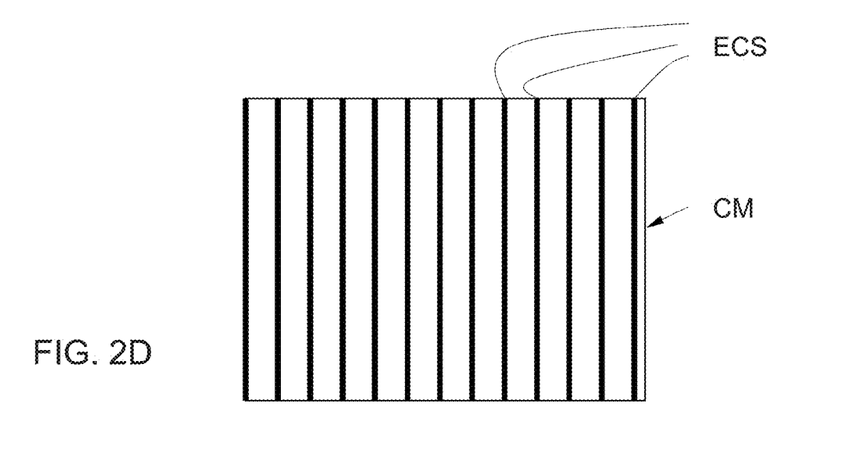
FIG. 2D shows a top-view of the flexible substrate according to D in FIG. 2C, FIG. 3A to FIG. 3F shows various examples of semi-finished products obtained with an apparatus according to the first aspect of the invention.

The press-roll 42 presses the flexible substrate FS with the carrier layer CM against the surface 22 of the transfer roll 20. The press-roll 42 is positioned in the rotation direction 24 of the transfer roll 20 with respect to a position where the first deposition facility 10 deposits the substance ECM on the transfer roll. Due to the pressure exerted by the pressure roll 42 on the flexible substrate FS against the surface 22 of the transfer roll the deposited substance ECM is embedded in the carrier layer CM. An adhesion between the printed substance ECM and the transfer roll 20 is less than an adhesion between the printed substance ECM and said carrier layer CM. The embedded substance ECM forms an electrically conductive structure ECS, as shown in FIG. 2C, which is a cross-section through the flexible substrate at position C in FIG. 1. FIG. 2D shows a top-view of the flexible substrate according to view D in FIG. 2C. In the embodiment shown the electrically conductive structure ECS is formed by a set of parallel conducting lines.

A transforming facility 50 is provided for transforming the carrier layer CM into a second state having an increased hardness as compared to the first state once the printed substance ECM is embedded in the carrier layer CM. The transforming facility 50 may formed in various ways. For example, the material used for the carrier layer CM may be a thermally hardening polymer (composition) and the location of the region, embedding region 26, where the substance ECM is embedded in the carrier layer CM may be heated to achieve said thermal hardening.

Alternatively a photo-curable composition may be used for the carrier layer, and hardening of the carrier layer is achieved by a photon radiation source 28 that irradiates the embedding region 26. In an embodiment the photon radiation source 28 is arranged within the transfer roll 20 and the transfer roll 20 has a cylindrical wall 29 of a material translucent for the photon radiation provided by the source 28. Alternatively a source 28a may be arranged in the pressure roll 42, provided that the latter is transparent. Also both a source 28 and a source 28a may be present.

In again another embodiment an auto-curing multi-component composition is deposited as the precursor for the layer CM. The composition of this multi-component composition, e.g. a two-component composition, is selected to achieve that process of curing of the layer CM occurs while the flexible substrate FS is pressed against the cylindrical surface 22 of the transfer roll 20.

A transport facility is provided for releasing the flexible substrate FS with the layer CM embedding the patterned electrically conductive structure ECS from the transfer roll. Here the transport facility is formed by the storage roll 44 that winds the flexible substrate FS with a sufficient force to release the flexible substrate FS from the transfer roll 20. Alternative or additional facilities e.g. one or more S-rolls may be present for this purpose.

Figure 3A:
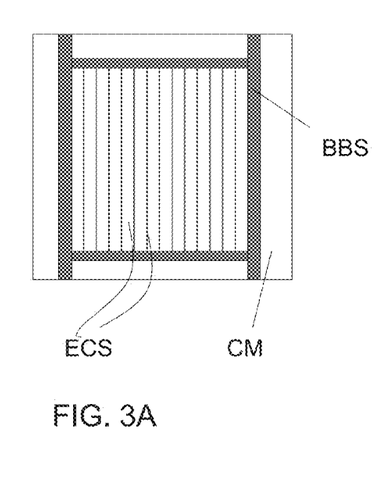

As shown in FIG. 3A, the electrically conductive structure ECS embedded in the carrier layer CM, may be connected to a busbar structure BBS. In an opto-electric device the busbar structure BBS typically is arranged outside the active area, i.e. the area comprising the opto-electric medium and is formed of relatively wide lines. The busbar structure BBS may also be embedded in the carrier layer CM.

In the embodiment shown the substance is printed as lines extending in the length direction of the transfer roll 20, i.e. parallel to the rotation axis of the transfer roll 20. However, many alternatives are possible to deposit the substance. It is merely essential that a pattern of line elements of the substance is deposited on the transfer roll 20 to be transferred to, and embedded in the carrier layer CM to form an electrically conductive structure. Examples are shown in FIG. 3B to 3F.

Figure 3B:
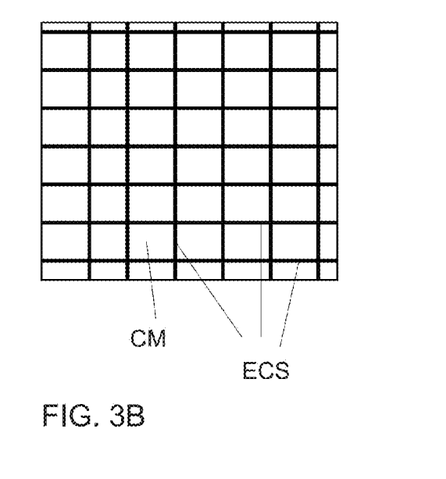

FIG. 3B shows an embodiment wherein the electrically conductive structure is formed by a grid of mutually transverse lines.

Figure 3C:
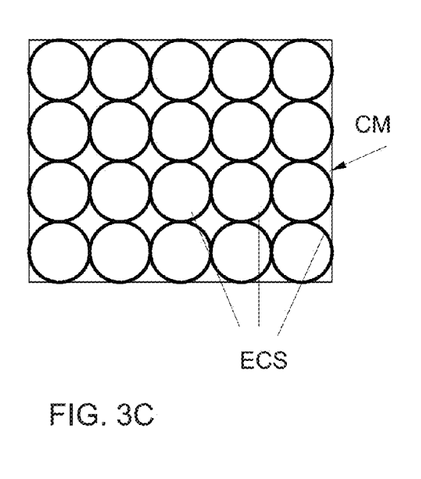

FIG. 3C shows an embodiment wherein the electrically conductive structure is formed as a pattern of mutually interconnected circular elements.

Figure 3D:
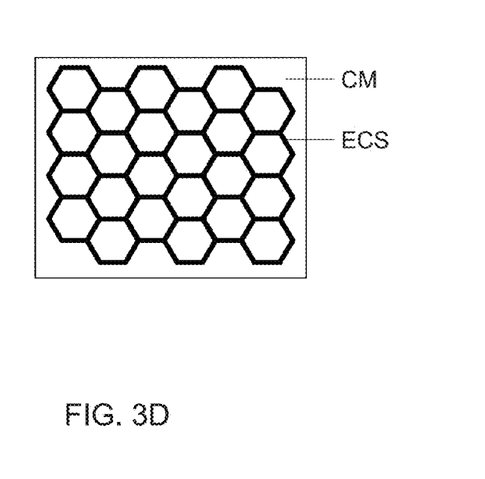

FIG. 3D shows an embodiment wherein the electrically conductive structure is formed as a pattern of mutually interconnected octagon shaped elements.

Instead of a single electrically conductive structure it is alternatively possible to embed a plurality of mutually separate electrically conductive structures in the carrier layer.

Figure 3E:
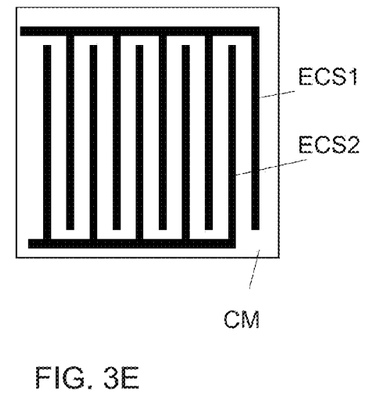

According to one embodiment shown in FIG. 3E a first and a second electrically conductive structure ECS1, ECS2 are embedded in the carrier layer CM. Here the first and the second electrically conductive structure ECS1, ECS2 are formed as comb-like structures that grip into each other.

Figure 3F:
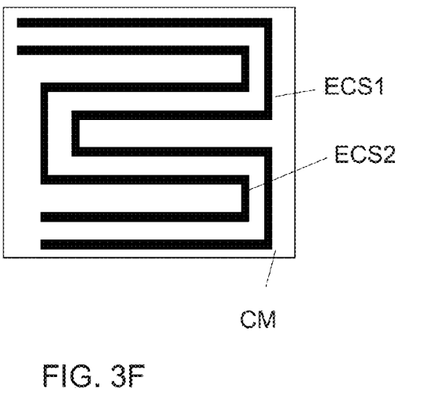

According to another embodiment shown in FIG. 3F a first and a second electrically conductive structure ECS1, ECS2 embedded in the carrier layer CM extend alongside each other according to a meandering pattern. This embodiment can easily be generalized to a larger number electrically conductive structures.

Figure 1A:
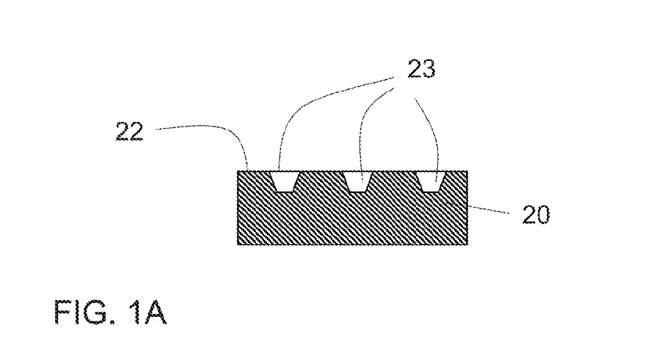

As shown in FIG. 1A, the cylindrical surface 22 of the transfer roll 20 may be provided with grooves 23 for receiving the deposited substance ECM. In particular the grooves 23 may be formed in a pattern that corresponds to the pattern in which the substance ECM is deposited on the cylindrical surface 22. FIG. 1A shows a part of a cross-section of the transfer-roll 20 through its rotation axis. This part corresponds to IA in FIG. 1.

Figure 4:
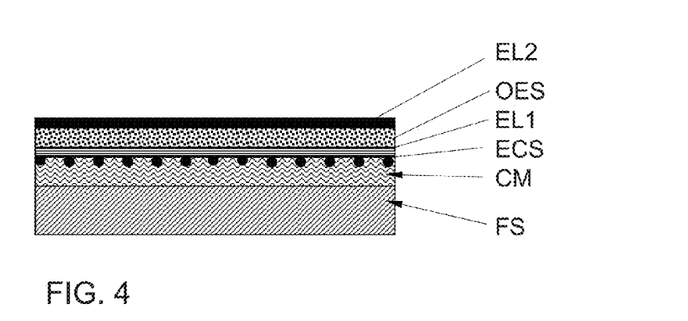
FIG. 4 shows an example of an end-product obtainable with an apparatus according to the third aspect of the present invention.

The opto-electric device shown in FIG. 4 comprises in addition to the electrically conductive structure of FIG. 2C a first electrode layer EL1 on the layer CM, in electrical contact with the electrically conductive structure ECS embedded therein. An opto-electric structure OES is arranged on said first electrode layer EL1 and a second electrode layer EL2 is arranged on said opto-electric structure OES. The opto-electrical structure OES may be a light-emitting structure that comprises one or more light-emitting layers. In addition other layers may be present, such as a hole injection layer, a hole-transport layer, an electron injection layer and an electron transport layer. Alternatively the opto-electrical structure may be a photo-voltaic structure, comprising one or more photo-voltaic layers. The first electrode layer EL1 is a transparent electrode layer. I.e. if the opto-electrical device is a light-emitting device the transparent electrode layer EL1 should have a transmission for the radiation generated by the device of at least 50%, but more preferably at least 75% and most preferably at least 90%. If the opto-electrical device is a photo-voltaic cell, the transparent electrode layer EL1 should have the desired transparency for the radiation to be converted by the photo-voltaic layer.

Dependent on the type of opto-electric device also other structures or layers may be provided. For example if the opto-electric device is an OLED barrier layers may be provided to counteract an ingress of moisture or other substances from the atmosphere. Also light diffusion layers, anti-scratch layers etc. may be provided.

Figure 5:
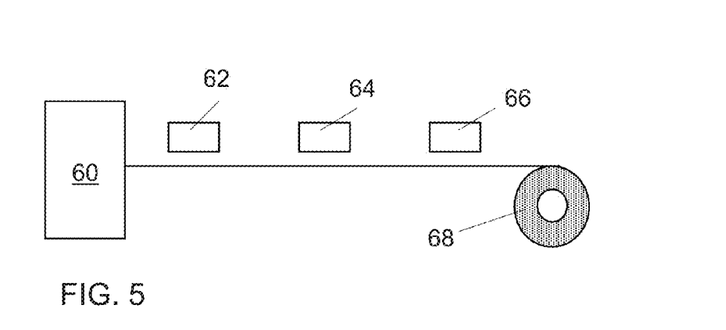
FIG. 5 shows an example of an embodiment of an apparatus according to the third aspect of the present invention.

FIG. 5 schematically shows how an electrically conductive structure obtained with the apparatus of FIG. 1 is further used to manufacture an opto-electric device as shown in FIG. 4.

The apparatus of FIG. 5 comprises an apparatus 60 for providing an electrically conductive structure, for example as described with reference to FIG. 1.

The apparatus additionally comprises a facility 62 for applying a first electrode layer EL1 on the layer CM, in electrical contact with the electrically conductive structure ECS embedded therein. The first electrode layer EL1 may for example be an organic layer that is applied by a printing process. In another example the first electrode is an inorganic layer that is applied by a vapor deposition process.

The apparatus additionally comprises a facility 64 for applying an opto-electric structure on said first electrode layer. The facility may comprise one or more printing facilities for applying one or more layers of an opto-electric material.

A further facility 66 serves to apply the second electrode layer EL2 on the opto-electric structure. The product obtained is stored on storage roll 68.

Figure 6:
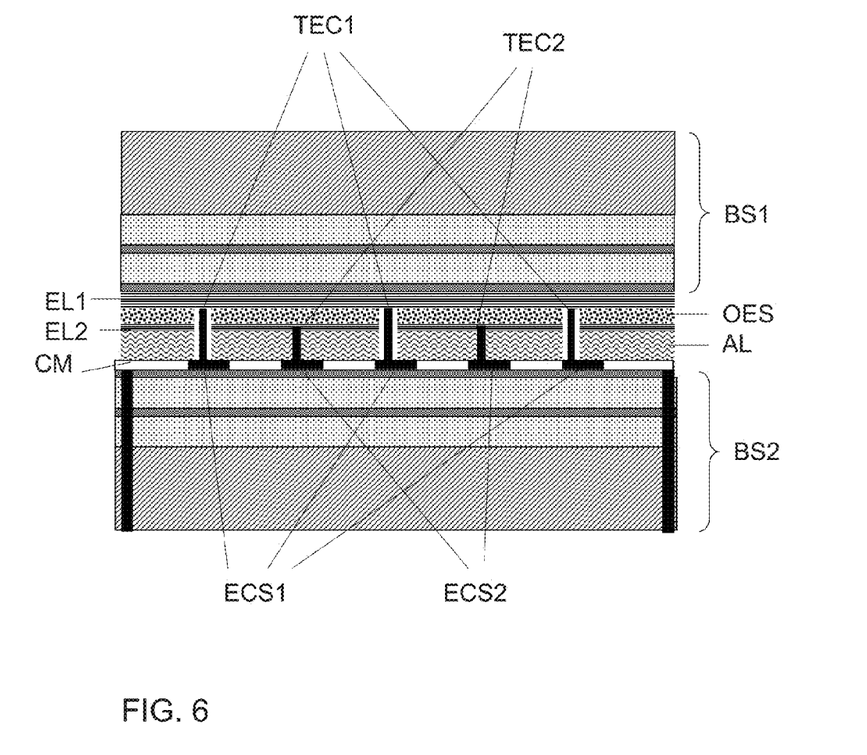
FIG. 6 shows another example of an end-product obtainable with an apparatus according to the third aspect of the present invention.

FIG. 6 shows an alternative embodiment of an opto-electric device. The device therein comprises a pair of a first and a second electrically conductive structure ECS1, ECS2 embedded in a carrier layer CM as shown in FIG. 3E or 3F for example. The first and the second electrically conductive structure ECS1, ECS2 are each connected to a proper electrode layer EL1, EL2 via transverse electrical conductors TEC1, TEC2. The opto-electric device has a first and a second barrier structure to avoid an ingress of moisture and oxygen. The opto-electric device has a top part comprising the opto-electric structure and a bottom part comprising the layer CM with the embedded electrically conductive structures ECS1, ECS2. The bottom and the top part are adhered to each other by an adhesive layer AL. This is advantageous as it allows an independent manufacturing of top- and bottom part as is disclosed in more detail in the earlier Application WO/2010/005301.

The substance to be deposited as the electrically conductive material or precursor thereof is for example an ink containing metal nano particles. An example thereof is a silver nanoparticle dispersion in an ethylene glycol/ethanol mixture as provided by Syntronics. This silver ink contains 20 wt % of silver nanoparticles, with the particle diameter ranging from 30 to 50 nm. The viscosity and surface tension of this ink is 14.4 mPa·s and 31 mN m−1, respectively.

Alternatively metal complexes in organic or water based solvents may be used as the substance, for example silver complex inks comprising a mixture of solvents and silver amides, for example inks produced by InkTech. The silver amides decompose at a certain temperature between 130-150° C. into silver atoms, volatile amines and carbon dioxide. Once the solvents and the amines are evaporated, the silver atoms remain on the substrate. Other metal complexes based for example on copper, nickel, zinc, cobalt, palladium, gold, vanadium, and bismuth instead of silver may be used alternatively or in combination.

Furthermore conductive pastes, with various compositions, may be used instead of inks containing metal nano particles or metal complex inks.

In again another embodiment a molten metal may be deposited as the substance.

In a practical application the substance was deposited on the surface by printing, in particular by screen printing using a DEK Horizon screen printer (DEK international, GmbH, Germany) with a gull wing cover design and a screen with a mesh opening of 40 μm and a wire thickness of 0.025 mm.

As the substance the screen print InkTec TEC-PA-010 ink was used which has an estimated layer thickness of 2.5 μm with a line width of 300 μm after sintering. A honeycomb structure was printed and sintered in an oven at a temperature of 135° Celsius. The honeycomb structures were screen printed on PET foil with a SiN coating.

The flexible substrate was provided with a layer of a carrier material by spin coating with a UV-curable organic coating polymer. By pressing the flexible substrate with the so formed carrier layer against the surface with the screen printed honeycomb structure, the screen-printed structure was embedded in the carrier layer. While pressing, the layer was subjected to an UV treatment (254 nm). The flexible substrate with the layer embedding the patterned electrically conductive silver structure was then released from the transfer roll. In three experiments the contact time between the surface 22 and the carrier layer CM was subsequently set to 30, 90 and 180 s and the carrier layer CM was cured while in contact with the surface 22. In all cases a successful transfer of the electrically conductive silver structure from the cylindrical surface 22 to the carrier layer CM and embedment of said structure into the carrier layer CM was obtained.

Profile measurements of the sintered ink structures and cured OCP layer are done with a micro processor based Dektak Surface Profiler. The Dektak Surface Profiler is able to take accurate measurements on small vertical features ranging in height from 100 Å up to 655 kÅ. The data were obtained recording the movement of a sensitive diamond tipped stylus over the substrate.

Figure 7:
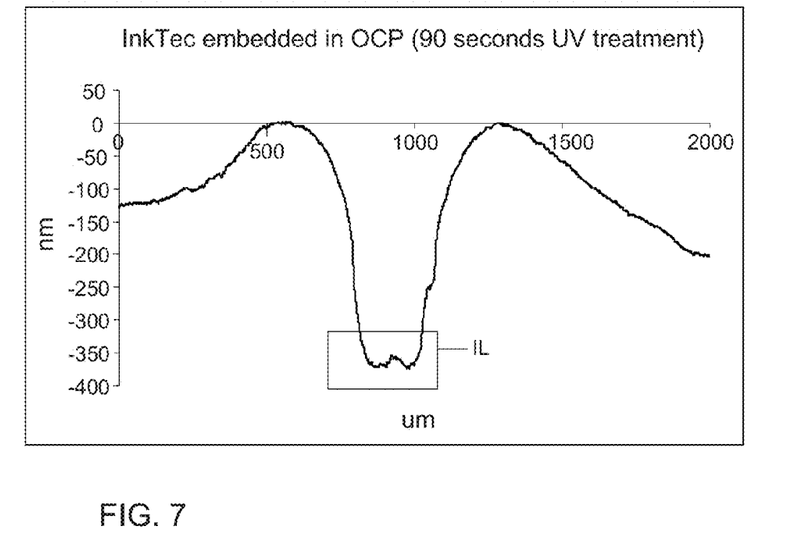
FIG. 7 shows results of a depth-profile measurement of a portion of an electrically conductive structure as shown in FIG. 3D.

The surface of the embedded ink line was determined and is showed in FIG. 7. In this graph the ink line IL is represented by the plateau at a depth of 350 nm with a width of 120 μm. Instead of a height difference of 3 μm of the silver line with the barrier, embedded the height difference between the ink line and OCP layer is 350 nm.

Figure 8:
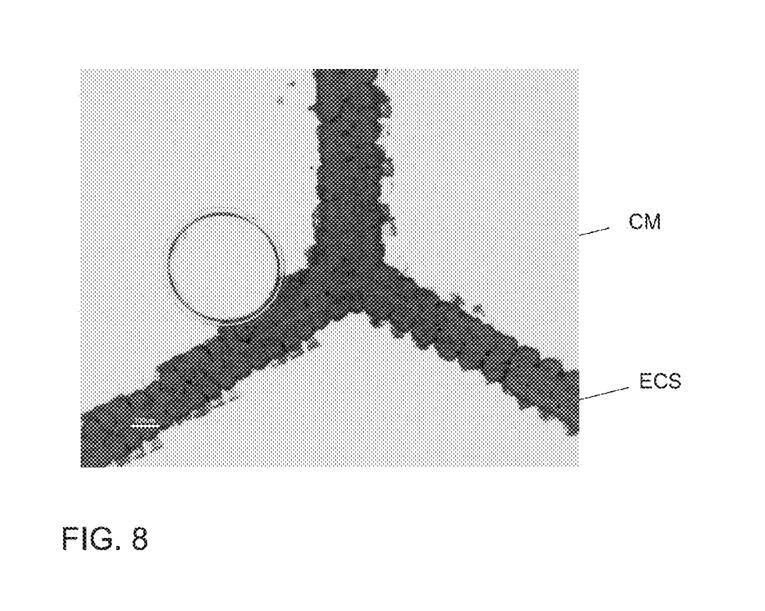
FIG. 8 shows microscope image of a portion of the electrically conductive structure as shown in FIG. 3D.

FIG. 8 shows a microscope photograph of an embedded electrically conducting structure (50×) obtained in this way. The circle near the conducting structure ECS is an encapsulated air bubble.

Figure 9A:
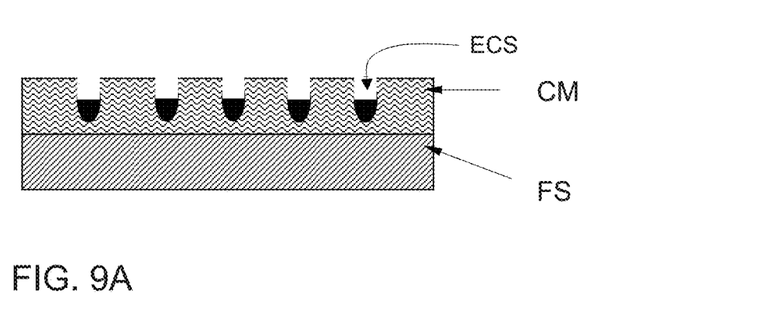
FIG. 9A shows a further example of a semi-finished product.
Figure 9B:
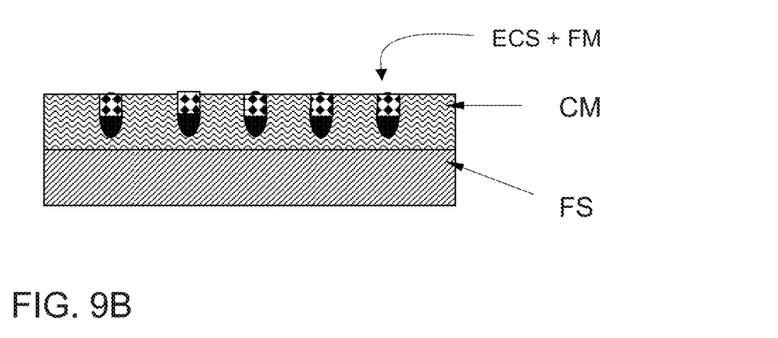
FIG. 9B shows the semi-finished product of FIG. 9A after application of a further step.

During exceptional circumstances the electrically conductive structure ECS may be embedded at level below the surface level of the carrier layer CM, as is schematically shown in FIG. 9A. This situation may occur if an exceptionally high pressure is exerted when by the pressure roll 42 or if the pressure is exerted during an exceptionally short contact time, or by an exceptionally rapid curing treatment. These circumstances may be used to advantage by filling the resulting grooves or pits with a further material FM, as schematically illustrated in FIG. 9B. The further material FM may be an additional electrically conductive material, but may alternatively be a semiconducting material, an insulating material or precursors thereof. In this way an embedded stack of layers is obtained.

Some additional measurements are shown in FIGS. 10A, 10B, 11A and 11B.

Figure 10A:
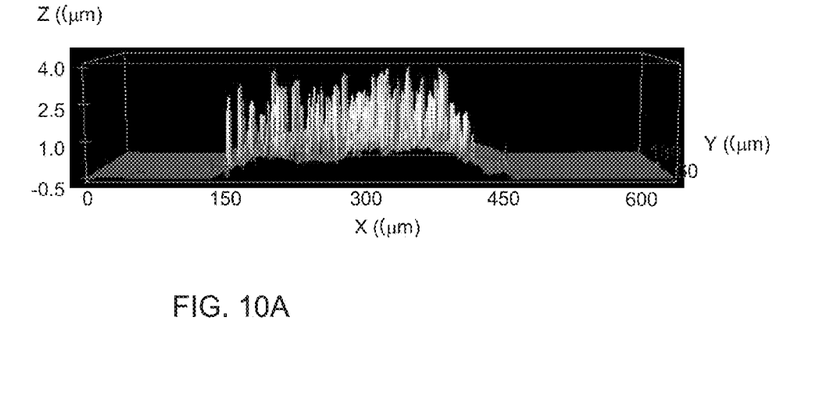
FIG. 10A shows a confocal microscopy image of a surface of a printed electrically conductive material.
Figure 10B:
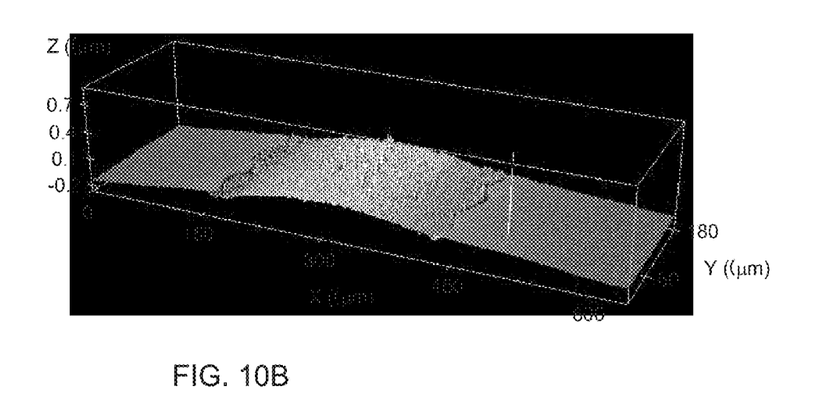
FIG. 10B shows a confocal microscopy image of a free surface of an embedded electrically conductive structure.
Figure 11A:
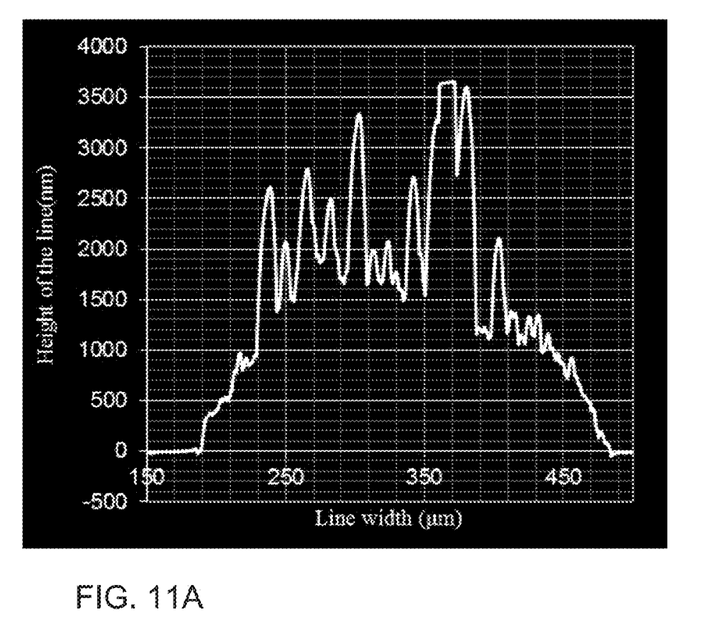
FIG. 11A shows a height profile in a cross-section transverse to a line of electrically conductive material.
Figure 11B:
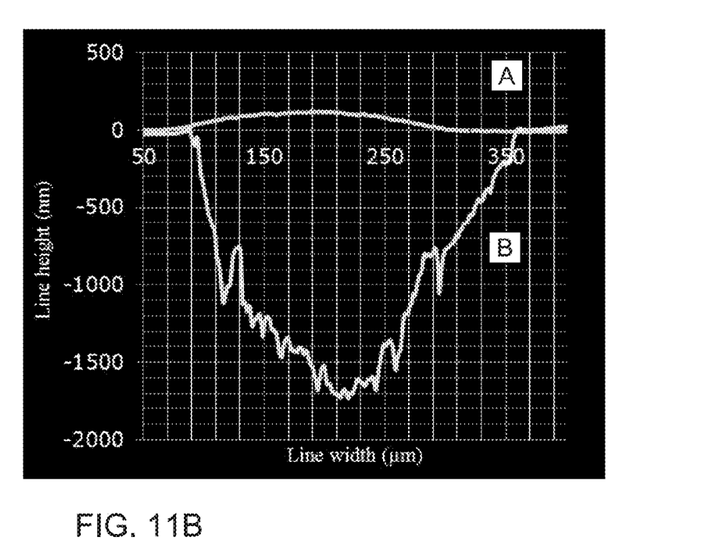
FIG. 11B shows height profiles in a cross-section transverse to a line of an embedded electrically conductive structure.

FIG. 10A shows an image of a portion of the surface of printed material ECM obtained by confocal microscopy measurements. FIG. 11A shows a height profile in a cross-section transverse to a length direction of a line of printed material ECM. FIG. 10B shows a portion of the surface of the embedded electrically conducting structure ECS. In FIG. 11B curve A and B show height profiles of a line of the embedded electrically conducting structure ECS in a cross-section transverse to a length direction of the line. Therein A shows the height profile of the free surface of the line and B shows the height profile of its embedded surface. It is clear from FIGS. 10A and 11A that the screen printed material ECM has a very rough surface with height differences up to 2 μm. On the contrary, as appears from FIGS. 10B and 11B the surface of the embedded electrically conducting structure ECS is substantially smooth. As can be seen in curve A in FIG. 11B, the height gradually changes from the reference level of the surface of the embedding material to a height of about 130 nm above this level in the centre of a line of embedded electrically conductive material.

Alternatively, an embedded stack of layers may be obtained by depositing a stack of substances on the cylindrical surface of a transfer roll, and subsequently pressing the flexible substrate with the carrier layer against the surface of the transfer roll so that the stack formed on the cylindrical surface is embedded in the carrier surface. This may be realized with an apparatus having additional deposition facilities for depositing the additional substances.

In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. Any reference signs in the claims should not be construed as limiting the scope.

The invention claimed is:
1. Method for providing an electrically conductive structure (ECS) comprising the steps of
  depositing a substance or a precursor thereof in a patterned way on a cylindrical surface of a transfer roll,
  providing a flexible substrate (FS) with a carrier layer (CM), pressing the flexible substrate (FS) with the carrier layer (CM) against the cylindrical surface of the transfer roll, therewith embedding the deposited substance in said carrier layer (CM), wherein an adhesion between the printed substance and the cylindrical surface of the transfer roll is less than an adhesion between the printed substance and said carrier layer (CM), the embedded substance forming an embedded electrically conductive structure (ECS), the carrier layer (CM) with said embedded electrically conductive structure (ECS) having a flat planar surface, releasing the flexible substrate (FS) with the layer (CM) embedding the patterned electrically conductive structure (ECS) from the transfer roll.

2. Method for manufacturing an opto-electric device, comprising the steps of providing an electrically conductive structure embedded in a layer on a flexible substrate according to claim 1, applying a first electrode layer (EL1) on the carrier layer (CM), in electrical contact with the electrically conductive structure (ECS) embedded therein, applying an opto-electric structure (OES) on said first electrode layer (EL1), applying a second electrode layer (EL2) on said opto-electric structure (OES).

* * * * *